(12) United States Patent
Suzuki

(10) Patent No.: US 7,604,833 B2
(45) Date of Patent: Oct. 20, 2009

(54) ELECTRONIC PART MANUFACTURING METHOD

(75) Inventor: Ryuusuke Suzuki, Ina (JP)

(73) Assignee: KOA Corporation, Nagano (JP)

( * ) Notice: Subject to any disclaimer, the term of this patent is extended or adjusted under 35 U.S.C. 154(b) by 681 days.

(21) Appl. No.: 10/569,767

(22) PCT Filed: Aug. 25, 2004

(86) PCT No.: PCT/JP2004/012174

§ 371 (c)(1),
(2), (4) Date: Feb. 24, 2006

(87) PCT Pub. No.: WO2005/022967

PCT Pub. Date: Mar. 10, 2005

(65) Prior Publication Data

US 2007/0015309 A1    Jan. 18, 2007

(30) Foreign Application Priority Data

Aug. 29, 2003   (JP) .............................. 2003-305735

(51) Int. Cl.
| | | |
|---|---|---|
| B05D 5/12 | (2006.01) | |
| B28B 19/00 | (2006.01) | |
| B29B 15/00 | (2006.01) | |
| C23C 18/00 | (2006.01) | |
| C23C 20/00 | (2006.01) | |
| C23C 24/00 | (2006.01) | |
| C23C 26/00 | (2006.01) | |
| C23C 28/00 | (2006.01) | |
| C23C 30/00 | (2006.01) | |
| H01C 17/06 | (2006.01) | |
| H05K 3/00 | (2006.01) | |

(52) U.S. Cl. ..................................... 427/96.5; 438/110

(58) Field of Classification Search ................ 427/96.5, 427/96.1; 438/113, 110
See application file for complete search history.

(56) References Cited

U.S. PATENT DOCUMENTS 6,054,338 A * 4/2000 Lee et al. .................... 438/110

(Continued)

FOREIGN PATENT DOCUMENTS

JP            3-4582          1/1991

(Continued)

*Primary Examiner*—Roberts Culbert
(74) *Attorney, Agent, or Firm*—Mark Montague; Cowan, Liebowitz & Latman, P.C.

(57) ABSTRACT

Provided is a method of manufacturing an electronic part in which a circuit element (3) is formed on a surface of a ceramic substrate (1) and conductive balls (2) are used as terminals of the electronic part. After the ceramic substrate (1) and the conductive balls (2) are fixed, the ceramic substrate (1) is appropriately divided. For this, the manufacturing method includes: a first step of forming the circuit element(s) (3) on the surface of a large ceramic substrate (1) including division grooves (4) longitudinally and laterally provided on the surface thereof; a second step of fixing the conductive balls (2) to terminal portion of the circuit element(s) (3); and a third step of applying stress to the large ceramic substrate (1) to open the division grooves (4), to divide the substrate (1), and the first, second, and third steps are performed in the stated order. The stress to be applied in the third step is substantially equally applied to large number of conductive balls (2) or no stress is applied to the conductive balls (2).

9 Claims, 4 Drawing Sheets

U.S. PATENT DOCUMENTS 6,326,677 B1    12/2001    Bloom et al.

FOREIGN PATENT DOCUMENTS

| JP | 10050886 A | * | 2/1998 |
| JP | 11-008334 | | 1/1999 |
| JP | 11-163193 | | 6/1999 |
| JP | 2000-286375 | | 10/2000 |
| JP | 2001053033 A | * | 2/2001 |
| JP | 2003-017829 | | 1/2003 |
| JP | 2003017829 A | * | 1/2003 |
| WO | WO 97 30641 | | 8/1997 |

* cited by examiner

ELECTRONIC PART MANUFACTURING METHOD

TECHNICAL FIELD

The present invention relates to a method of manufacturing an electronic part in which circuit elements are formed on a surface of a ceramic substrate and conductive balls are used as electronic part terminals.

BACKGROUND ART

An electronic part in which circuit elements are formed on a surface of a ceramic substrate and conductive balls are used as electronic part terminals is disclosed in U.S. Pat. No. 6,326,677 and WO97/30461.

Mass production of the electronic part is required to ensure a sufficient supply quantity when the electronic part is to be supplied for a similarly mass-produced electronic device. Therefore, in the case of the electronic part (for example, a chip resistor) in which the circuit elements are formed on the surface of the ceramic substrate, respective components of the circuit elements are formed for a large number of electronic parts by a thick-film technique or a thin-film technique on a surface of a large ceramic substrate in which division grooves are provided normally in advance. After that, the ceramic substrate is divided into respective electronic part units along the division grooves to realize the mass production.

Patent Document 1: U.S. Pat. No. 6,326,677

Patent Document 2: WO 97/30461

DISCLOSURE OF THE INVENTION

Problems to be Solved by the Invention

However, it is difficult to realize the mass production of the electronic part in which the circuit elements are formed on the surface of the ceramic substrate and the conductive balls are used as the electronic part terminals. This is because the electronic part includes the ceramic substrate and the conductive balls fixed thereto.

If the conductive balls are fixed to the ceramic substrate before a division step and then the division step is to be performed in such a state, excessive stress may be concentrated on a fixed portion between the ceramic substrate and the conductive ball during the division step. As a result, peeling is caused between the ceramic substrate and the conductive ball. Therefore, it is likely that does not operate as the electronic part. In present technology, there are two typical one as the stress. One is a stress performed so as to bend the ceramic substrate in a direction in which the division groove is opened. The other is a stress based on a vibration caused during a cutting step for dicing the ceramic substrate.

If the conductive balls are to be fixed to the ceramic substrate after the division step, it is necessary to perform, for example, an operation for putting integrally formed parts in matrix again. As a result, a manufacturing process is further complicated. Therefore, this is unsuitable for the mass production of the electronic part.

Thus, in order to solve the problems, an object of the present invention is to perform a suitable division of the ceramic substrate after the conductive balls are fixed to the ceramic substrate.

Means for Solving Problems

In order to solve the above-mentioned problems, a first method of manufacturing an electronic part in which a circuit element 3 is formed on a surface of a ceramic substrate 1 and conductive balls 2 are used as terminals of the electronic part, includes: a first step of forming a circuit element 3 on the surface 1 of the large ceramic substrate including division grooves 4 longitudinally and laterally provided on the surface thereof; a second step of fixing the conductive balls 2 to terminal portions of the circuit element 3; and a third step of applying stress to the substrate 1 to open the division grooves 4, to divide the substrate 1, the first, second, and third steps being performed in the stated order, and is characterized in that the whole stress to be applied in the third step is substantially equally applied to a large number of conductive balls 2, or the whole stress is applied to the substrate 1 and/or the circuit element 3, or a part of the stress is substantially equally applied to a large number of conductive balls 2 and a remainder of the stress is applied to the substrate 1 and/or the circuit element 3.

In view of mass production, it is particularly preferable to perform a method of forming the circuit element 3 in the first step using screen printing. The circuit element 3 is a resistor element, a condenser element, an inductor element, a multiple element or a network element in which a large number of one kind of those are included in a single electronic part, a composite element represented by a CR part in which a combination of two or more kinds of those is included in a single electronic part, or the like.

When the conductive balls 3 are to be fixed with the terminal portions of the circuit element 3 in the second step, it is possible to use an available ball grid array (BGA) type ball placement system for electronic part or the like in a state in which cream solder or the like is screen-printed to a position to be fixed, for example.

Here, instead of the cream solder, a conductive bonding agent in which, for example, a silver material or a carbon material is dispersed in epoxy resin paste or the like can be preferably used. Because resin is softer than metal, even when the stress is applied to the conductive balls 2, the stress can be absorbed by the resin. Therefore, there is an advantage in that fixation between the substrate 1 and the conductive ball 2 is not easily reduced by the stress applied during the division step.

When the stress is to be substantially equally applied to a large number of conductive balls 2 in the third step, for example, as shown in FIGS. 1 and 2, a buffer member 5 made of styrene foam, sponge, cloth, rubber, resin, or the like is placed on the large number of conductive balls 2 to apply the stress to the large number of conductive balls 2 through the buffer member 5. Because of the presence of the buffer member 5, a part of or the entire applied stress does not concentrate on one of or a small number of conductive balls 2 and the stress is dispersed to the large number of conductive balls 2. As a result, there is a first effect in which the ceramic substrate 1 and a specific conductive ball 2 are prevented from peeling. Alternatively, a part of or the entire stress is applied to the substrate 1 and/or the circuit element 3. As a result, there is a second effect in which the stress is not applied to the conductive balls 2 and thus the ceramic substrate 1 and the specific conductive ball 2 are prevented from peeling. In some cases, one of or both the first effect and the second effect are obtained.

In the above description, "large number" included in "large number of conductive balls" corresponds to a number to the extent to which a fixation state between the conductive ball 2 and the substrate 1 is not substantially affected even when the stress is substantially equally applied to all those. Therefore, the number of conductive balls is changed based on a stress condition, the fixation state, a diameter of each of the conductive ball 2, a size of the substrate 1, a depth of each of the division grooves 4, and the like. However, the number is normally substantially equal to or larger than one-fourth of a total number of the conductive balls 2 fixed to the substrate 1.

Flexibility of the buffer member 5 may be lower than rigidity of the ceramic substrate 1, may follow a warp of the substrate 1 before it is divided, and may be the extent to which the buffer member 5 is not broken. Therefore, even when a member is recognized to be a "rigid body" based on the generally-accepted idea, the member may become the "buffer member 5" in some cases. For example, a phenol resin, a hard rubber, or the like may become the "buffer member 5".

As shown in FIG. 2, it is preferable that the buffer member 5 have a portion which is in contact with an end surface of the substrate 1. This is because, during an operation for fitting the substrate 1 to the buffer member 5, the portion acts to prevent the positions of both from displacing and thus is advantageous. In addition, this is because a contact portion between the end surface and the buffer member 5 can absorb the stress applied to the conductive balls 2 in a lateral direction (direction parallel to the surface of the substrate 1) to further make a stress dispersion effect to the buffer member 5. In order to obtain the same effect, the substrate 1 has a portion extending from the end surface of the substrate in a direction substantially perpendicular to the surface of the substrate 1. Therefore, the buffer member 5 can also be mounted on the surface of the substrate 1 while the buffer member is fit to the portion of the substrate so as to be in contact with the portion thereof. That is, when the buffer member 5 and the substrate 1 are to be fit, a fitting side and a side to be fit can be reversed to each other.

As shown in FIG. 2, it is preferable that an area of a portion which becomes a convex portion of the buffer member 5 relative to the presence of a concave portion 6 thereof is larger than that of the concave portion 6. This is because the extent to which the stress is substantially dispersed through the convex portion may be large.

To prevent the conductive balls 2 from the stress in the third step, for example, the stress is applied only to the ceramic substrate 1. Beside this, the stress is applied to, for example, only the circuit element 3 or the circuit element 3 and the ceramic substrate 1. Even in such the case, there is an effect in which the ceramic substrate 1 and the specific conductive ball 2 are prevented from peeling. To be more specific, as shown in FIG. 2, a stress applying jig (such as the buffer member 5) is formed in a grid shape so as to avoid a contact with the conductive balls 2. The grid shape portion is formed, for example, to be contact with the ceramic substrate 1 only and/or the circuit element 3 only.

In an example in which, in the third step, a part of the stress is substantially equally applied to the large number of conductive balls 2 and the remainder of the stress is applied to the ceramic substrate 1 and/or the circuit element 3, there is, for example, a structure in which a rosin material such as flux is injected between the conductive balls 2 above the surface of the substrate 1. The rosin material may exist at a height which exceeds that of a top portion of the conductive ball 2 or may exist at a height which is lower than that of the top portion. The rosin material has both a bonding effect and a buffering effect, so the fixation between the conductive ball 2 and the substrate 1 is enhanced and the stress directly applied to the specific conductive ball 2 is transferred to the vicinity thereof to substantially equally apply the stress to the large number of conductive balls 2. Therefore, the rosin material has the same operation as that of the buffer material 5. The buffering effect becomes significant in a case where the rosin material exists at a height which exceeds that of the top portion of the conductive ball 2. This is because it is difficult to directly apply the stress to the specific conductive ball 2.

After the division step is completed, the rosin material can be removed by cleaning using, for example, alcohol, ketone such as acetone, or ethyl acetate, that is, an organic solvent. When a material which can be removed after the division step instead of the rosin material is injected between the conductive balls 2 above the surface of the substrate 1, the same operation as that of the rosin material can be made.

According to the first manufacturing method, the ceramic substrate 1 can be suitably divided after the conductive balls 2 are fixed to the ceramic substrate 1. Here, the word "suitably" means that, for example, the ceramic substrate 1 and the conductive balls 2 are prevented from peeling.

In order to solve the above-mentioned problems, a second method of manufacturing an electronic part in which a circuit element 3 is formed on a surface of a ceramic substrate 1 and conductive balls 2 are used as terminals of the electronic part, includes: an eleventh step of forming a circuit element 3 on the surface of the large ceramic substrate 1; a twelfth step of fixing the conductive balls 2 to terminal portions of the circuit element 3; a thirteenth step of forming division grooves 4 for the substrate 1 on the surface of the substrate 1 on which the circuit element 3 exists; and a fourteenth step of applying stress to the substrate 1 to open the division grooves 4, to divide the substrate 1, the eleventh, twelfth, thirteenth, and fourteenth steps being performed in the stated order, and is characterized in that the whole stress to be applied in the fourteenth step is substantially equally applied to a large number of conductive balls 2, or the whole stress is applied to the substrate 1 and/or the circuit element 3, or a part of the stress is substantially equally applied to a large number of conductive balls 2 and a remainder of the stress is applied to the substrate 1 and/or the circuit element 3.

The eleventh step substantially corresponds to the first step in the first manufacturing method. The twelfth step corresponds to the second step in the first manufacturing method. The fourteenth step corresponds to the third step in the first manufacturing method.

A difference between the eleventh step and the first step resides in whether or not the division groove 4 is formed in advance on the surface of the ceramic substrate 1. Although the division groove 4 is not formed in advance on the surface of the ceramic substrate 1 in the eleventh step, the division groove 4 is formed in the later thirteenth step. Such a forming method is based on, for example, dicing processing. Unlike the cutting and division step for dicing the ceramic substrate 1, the dicing processing is processing for forming a slight shallow groove on the surface of the ceramic substrate 1 without completely cutting the ceramic substrate 1. Therefore, because of a vibration caused during the processing, there is no case where excessive stress concentrates on a fixed portion between the ceramic substrate 1 and each of the conductive balls 2. In processing until the ceramic substrate 1 is cut, although a blade such as a dicing blade is used, the blade significantly wears. This is because the ceramic substrate 1 is made of a very hard material. However, in the processing for forming the slight shallow groove on the surface of the ceramic substrate 1, the wear is not so significant. Therefore, in view of mass production of the electronic part as in the case of the present invention, the above-mentioned method may be a suitable method of forming the division groove 4.

The advantage of forming the division groove 4 after the formation of the circuit element 3 in the thirteenth step is that, even when the circuit element 3 is formed in any position, the division groove 4 can be formed in a suitable position based on a formation of the circuit element 3. If the ceramic substrate 1 is subjected to the groove formation before the formation of the circuit element 3, a difficulty on forming the circuit element 3 becomes very large. This is because it is not acceptable to form the circuit element 3 whose position is displaced.

When the rosin material or the like is used for the buffer member 5 in the thirteenth step, it is preferable to form the division groove 4 after the rosin material is injected between the conductive balls 2 above the surface of the substrate 1 and hardened. When the above described division groove 4 is formed, the buffer member 5 is cut along the division groove 4 at the same time. In this case, there is an advantage in that the stress applied at the time of division is small. This reason is that, the presence of the rosin material or the like may become a divisional hindrance, so the hindrance can be removed by the cutting.

In the first and second manufacturing methods, it is preferable that the surface of the ceramic substrate 1 on which the circuit element 3 is formed, and the surface on which the division groove 4 exists, are the same surface. In the first manufacturing method, this is because a positional relationship with the division groove 4 can be visually checked in the step of forming the circuit element 3 (first step). In the second manufacturing method, this is because a positional relationship with the circuit element 3 can be visually checked in the step of forming the division groove 4 (thirteenth step). In the first and second manufacturing methods, when the stress is applied in a direction in which the division groove 4 is opened and the division is performed along the division groove, there is an advantage of that the conductive balls 2 adjacent to each other which place the groove between don't knock against each other.

EFFECT OF THE INVENTION

According to the present invention, the ceramic substrate can be suitably divided after the conductive balls are fixed to the ceramic substrate.

DESCRIPTION OF REFERENCE NUMERALS

Figure 1:
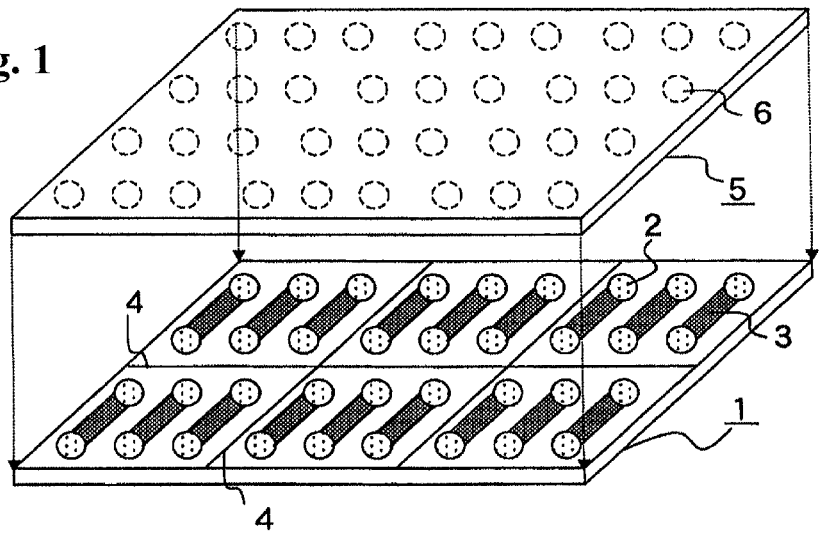
FIG. 1 A perspective view according to the present invention, showing an example of an outline of a state in which a buffer member is fit to a surface of a large substrate on which circuit elements and conductive balls are formed and arranged such that a concave portion is aligned with positions of the conductive balls.

1 substrate
2 conductive ball
3 circuit element
4 division grooves
5 buffer member
6 concave portion
7 land, electrode
8 roller
9 belt
13 resistor
14 glass film
16 overcoat
19 fluxes
20 common electrode

BEST MODE FOR CARRYING OUT THE INVENTION

Embodiment of First Manufacturing Method

An example of a best mode for carrying out the present invention based on the first manufacturing method will be described below.

A large alumina ceramic substrate 1 having a thickness of 0.5 mm, which is molded so as to longitudinally and laterally form a large number of division grooves 4 on a surface thereof in advance and which has been subjected to a sintering step is prepared. Each of minimum unit substrates 1 obtained after division along the division grooves 4 becomes a single electronic part. A process for forming circuit elements 3 and the like on the surface of the large alumina ceramic substrate 1 having the grooves will be described below with reference to the drawings. In the drawings, the minimum unit substrate 1 is shown.

Figure 4:
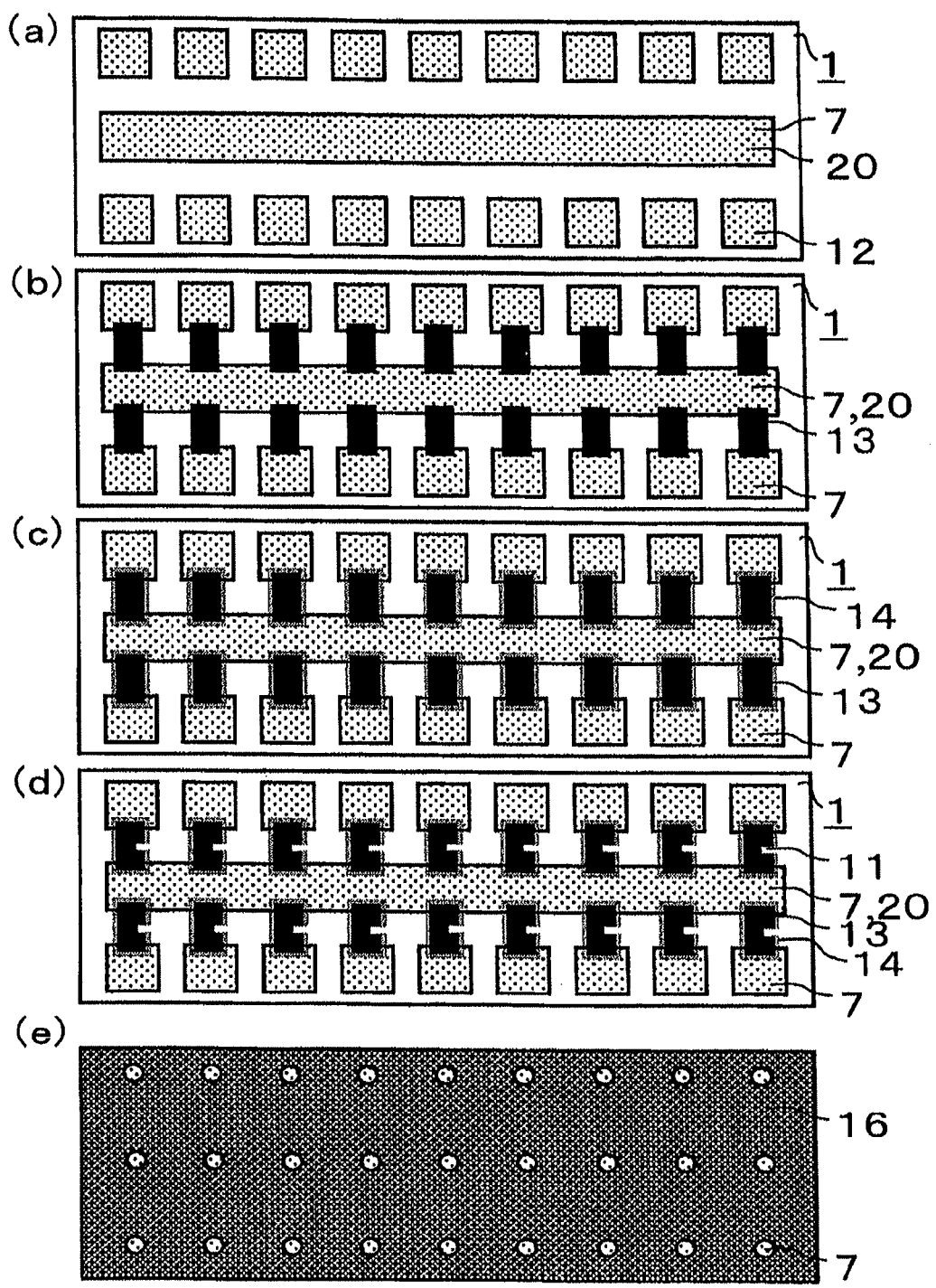
FIG. 4 An example of an embodiment of the present invention, which sequentially shows states in which a circuit structure of a single electronic part is formed.

First, an Ag—Pd conductive paste containing a glass frit is screen-printed on the surface of the substrate 1 on which the division grooves 4 are formed and then baked to obtain lands 7 that hold electrodes for circuit elements 3 concurrently and lands 7 that hold common electrodes 20 for circuit elements 3 concurrently (FIG. 4(*a*)). Next, a metal glaze resistor paste containing mainly a ruthenium oxide and a glass frit is screen-printed so as to be in contact with both the common electrode 20 and the electrode 7 and then baked to obtain resistors 13 (FIG. 4(*b*)). Then, a glass paste is screen-printed so as to cover the resistors 13 and then baked the substrate so as to obtain glass films 14 (FIG. 4(*c*)). Then, in order to set a resistance value of a resistor element which is composed of the electrode 7, the common electrode 20, and the resistors 13 to a desirable value, a step of forming trimming grooves on the resistors 13 by laser irradiation to adjust the resistance value is performed (FIG. 4(*d*)). At this time, the glass films 14 act to minimize damage to all parts of the resistors 13. Then, an overcoat 16 serving as a protective film is screen-printed using an epoxy resin paste so as to protect all the resistor element and then the epoxy resin paste is hardened by heating (FIG. 4(*e*)). When the overcoat 16 is placed, land 7 portions necessary for the electrode 7 and the common electrode 20 are exposed (FIG. 4(*e*)). After that, the first step is completed. Note that the circuit element 3 structure of the single electronic part as shown in FIG. 4 is different from the circuit element 3 structure shown in FIG. 1 and a so-called network resistor is constructed by the entire electronic part.

Figure 5:
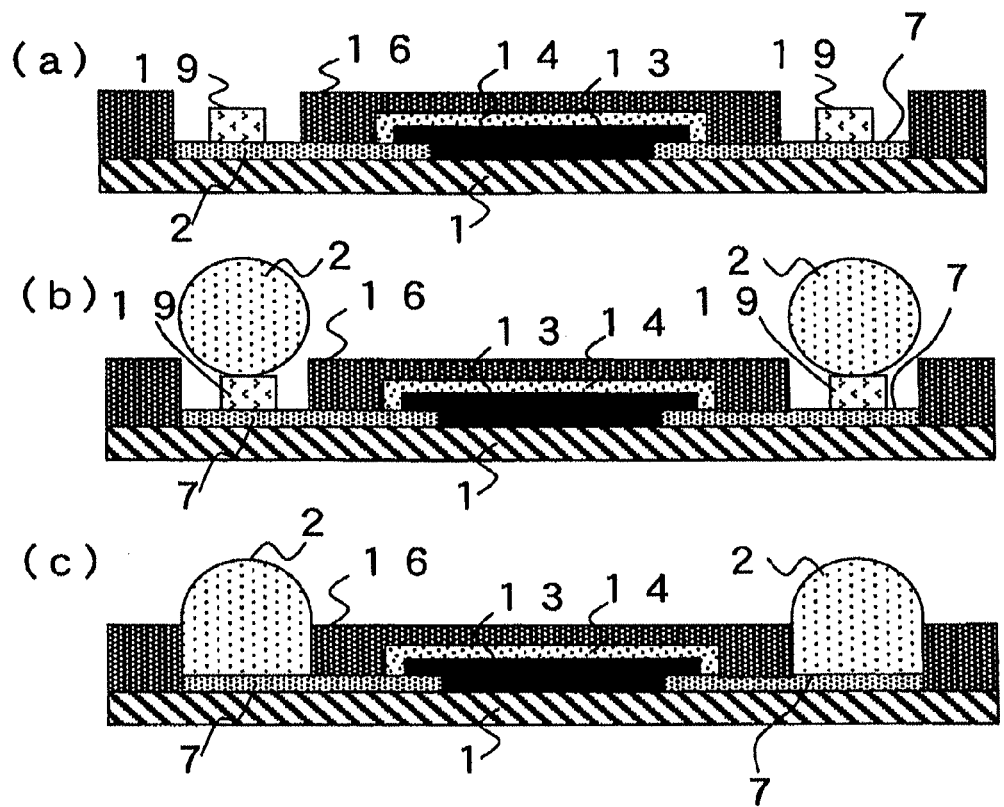
FIG. 5 An example of an embodiment of the present invention, which sequentially shows states in which the conducive balls are fixed onto lands of the substrate.

Next, high-viscosity fluxes 19 are located on the lands 7 obtained by the formation of the overcoat 16 (FIG. 5(a)). The fluxes 19 to be used are produced by Senju Metal Industry Co., Ltd. (product name: Deltalux529D-1). The locating method is a pin transfer method. Attention at the time of location is that each of the fluxes 19 is within a land 7 region and exists in a region narrower than the land 7 region. The pin transfer method used here is a method of bringing the flux into contact with a tip of a needle member and speedily bringing the tip into contact with an upper portion of the land 7 to apply the flux adhered to the tip to the land.

Instead of the pin transfer method, a screen printing method, a ball transfer method using the conductive ball 2 instead of the pin, a dispenser method, or the like can be employed. Instead of the flux 19 (product name: Deltalux529D-1), a flux having a viscosity or an adhesion property which is equal to that of the flux 19 can be used.

Next, the conductive ball 2 is located using an available ball placement system (FIG. 5(b)) and then the land 7 and the conductive ball 2 are fixed to each other (FIG. 5(c)). The conductive ball 2 has a surface layer made of tin (so-called lead-free solder) and a core made of copper. The fixing process is based on a known reflow step. The second step ends above described.

Figure 2:
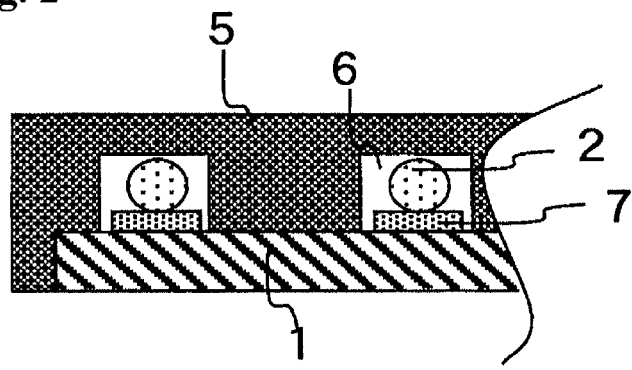
FIG. 2 A partially sectional view according to the present invention, showing an example of an outline of a state in which the buffer member is fit to the large substrate on which the circuit elements the conductive balls are formed and arranged.

Next, as is apparent from the outline shown in FIGS. 1 and 2, the buffer member 5 made of a hard rubber is fit to the surface of the large substrate 1 to which the conductive balls 2 are fixed and then fixed to the substrate. The buffer member 5 has the concave portion 6 corresponding to a portion in which each of the conductive balls 2 exists. The concave portion 6 houses the conductive ball 2 so as to cover upper and surrounding portions thereof. The buffer member 5 has a shape in which a portion which becomes the convex portion relative to the presence of the concave portion 6 is in contact with the surface of the ceramic substrate 1 and/or the circuit element 3. As shown in FIG. 2, the buffer member 5 has the portion which is in contact with the end surface of the substrate 1. Therefore, even when an upper surface of the buffer member 5, that is, a smooth surface opposed to a smooth surface of the large substrate 1 which is the fixed state is slightly pressed, the stress to be applied does not concentrate on one or a small number of conductive balls 2. Thus, the stress is dispersed to the large number of conductive balls 2 located around the pressed portion.

Figure 3:
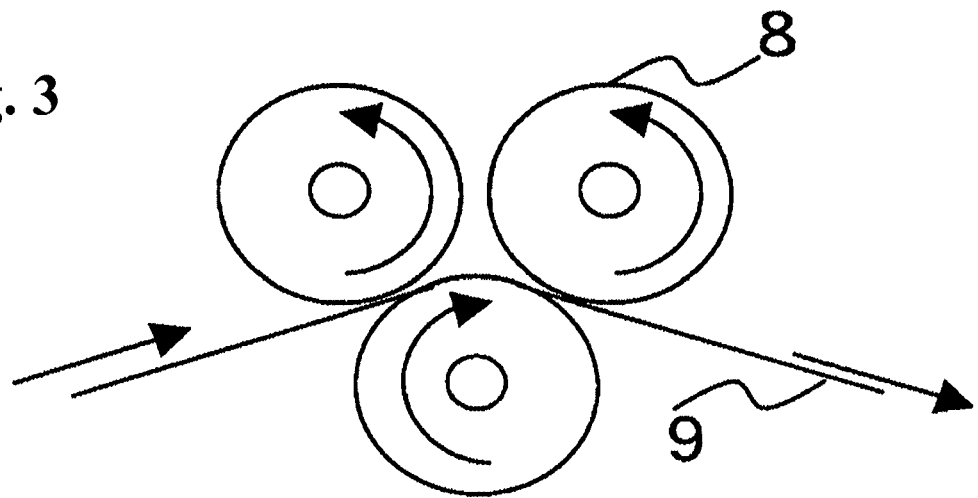
FIG. 3 A state showing which stress is applied so as to bend the large substrate when the large substrate is placed on a belt and passes between rollers.

With such a state, the stress is applied in the direction in which the division groove 4 is opened. As shown in FIG. 3, the application of the stress is realized by passing a work body in which the buffer member 5 is fit to the large substrate 1 between rollers 8 while the work body is placed on a belt 9. In this case, the division is performed along the longitudinal or lateral division grooves 4 formed on the surface of the substrate 1. After the division is completed, the division is performed along only the other direction. This is because it may be difficult to simultaneously perform the division along both the longitudinal and lateral division grooves 4. The third step ends above described.

As a result, there was no case where peeling was caused between the substrate 1 and each of the conductive balls 2. In addition, there was no case where, although the peeling was not caused, the fixation between the substrate 1 and the conductive ball 2 reduced.

Embodiment of Second Manufacturing Method

An example of a best mode for carrying out the present invention based on the second manufacturing method will be described below.

Except for the use of the substrate 1 on which the division grooves haven't been formed in advance, a step with the same condition as that of the first step and a step with the same condition as that of the second step in the embodiment mode of the first manufacturing method are performed. The eleventh and twelfth steps in the second manufacturing method ends above described.

Then, the division grooves 4 are formed on the surface of the substrate 1 on which the circuit elements 3 are formed. The formation of the division grooves 4 is based on dicing using a dicing saw in which diamond powders are adhered to the surface thereof. The dicing is performed using an available tool and an available apparatus on the market. When the division grooves 4 are formed by the dicing, a positional relationship between the division grooves 4 and the circuit elements 3 is adjusted such that a large number of division grooves 4 are longitudinally and laterally formed on the surface of the substrate 1 and a segment surrounded by the division grooves 4 becomes a single electronic part. The thirteenth step in the second manufacturing method ends above described.

The buffer member 5 used in the third step in the embodiment of the first manufacturing method is used as in the embodiment thereof and the division step is performed. The fourteenth step in the second manufacturing method ends above described.

As a result, as in the embodiment of the first manufacturing method, there was no case where peeling was caused between the substrate 1 and each of the conductive balls 2. In addition, there was no case where, although the peeling was not caused, the fixation between the substrate 1 and the conductive ball 2 reduced.

Other Embodiments

In the above-mentioned first and second embodiments, the conductive balls 2 are fixed to the land 7 located on the surface of the large substrate 1 on which the circuit elements 3 are formed. However, the conductive balls 2 may be fixed to a surface opposed to the surface of the large substrate 1 on which the circuit elements 3 are formed. In such the case, it is necessary to provide, for example, a via hole for making electrical connection between both surfaces of the substrate 1. In addition, it is necessary to locate the buffer member 5 on the surface of the substrate 1 to which the conductive balls 2 are fixed.

In the above-mentioned first and second embodiments, the division grooves 4 exist on the surface of the large substrate 1 on which the circuit elements 3 are formed. However, the division grooves 4 may exist on the surface opposed to the surface of the large substrate 1 on which the circuit elements 3 are formed. Note that, in view of the division which is normally performed in the direction in which the division groove 4 is opened, when a part of the circuit elements 3 is formed across the adjacent unit electronic parts, it is likely to cause peeling from the substrate 1 including the part thereof. Therefore, a structure in which the division grooves 4 exist on the surface of the large substrate 1 on which the circuit elements 3 are formed may be a more preferable structure.

In the above-mentioned first and second embodiments, when the conductive ball 2 is fixed to the land 7, only the high-viscosity flux 19 is interposed therebetween. However, for example, when the conductive ball 4 is made of a copper material in which solder does not exist on the surface thereof, it is preferable to interpose cream solder instead of or together with the high-viscosity flux 19 and perform a reflow step or the like. A condition suitable for the fixing can be selected based on a material of the surface of the conductive ball 2 and a material of the land 7. If necessary, the surface of the land 7 can be solder-plated to improve the surface of the land 7 so as to adhere solder easily. A conductive bonding agent can be used as a member for fixing the conductive ball 2 to the land 7 without the use of the solder.

In the above-mentioned first and second embodiments, the surface layer of conductive ball 2 is made of tin, so-called lead-free solder. For example, when lead-contained solder whose weight ratio of lead and tin is 95:5 is used, a heat cycle characteristic can be improved with the viscosity of the lead. When the lead-free solder is used in view of environmental harmony, an Sn—Bi alloy, an Sn—In—Ag alloy, an Sn—Bi—Zn alloy, an Sn—Zn alloy, an Sn—Ag—Bi alloy, an Sn—Bi—Ag—Cu alloy, an Sn—Ag—Cu alloy, an Sn—Ag—In alloy, an Sn—Ag—Cu—Sb alloy, an Sn—Ag alloy, an Sn—Cu alloy, or an Sn—Sb alloy can be used in addition to the use of only Sn as the above-mentioned embodiments.

INDUSTRIAL APPLICABILITY

According to the present invention, there is applicability in industries associated with an electronic part in which circuit elements are formed on a surface of a ceramic substrate and conductive balls are used as terminals of the electronic part.

The invention claimed is:

1. A method of manufacturing an electronic part in which at least one circuit element is formed on a surface of a ceramic substrate and conductive balls are used as terminals of the electronic part, comprising:
    a first step of forming at least one circuit element on the surface of a large ceramic substrate including division grooves longitudinally and laterally provided on the surface thereof;
    a second step of fixing the conductive balls to terminal portions of the circuit element; and
    a third step of applying stress to the large ceramic substrate to open the division grooves, to divide the substrate, the first, second, and third steps being performed in the stated order,
    wherein the third step is performed in a state in which a buffer member is located on the surface of the large ceramic substrate to which the conductive balls are fixed, the buffer member having a concave portion to house the conductive balls and a convex portion in contact with the surface of the substrate and/or the circuit element and by doing so, all stress to be applied in the third step is applied to the substrate and/or the circuit element.

2. A method of manufacturing an electronic part according to claim 1, wherein the division grooves exist on the surface of the substrate to which the conductive balls are fixed.

3. A method of manufacturing an electronic part according to claim 1, wherein the conductive balls are fixed to the substrate using a conductive bonding agent.

4. A method of manufacturing an electronic part according to claim 1, wherein the division grooves exist on the surface of the substrate on which the circuit element is formed.

5. A method of manufacturing an electronic part according to claim 1, wherein the concave portion of the buffer member does not come into contact with the conductive balls.

6. A method of manufacturing an electronic part in which at least one circuit element is formed on a surface of a ceramic substrate and conductive balls are used as terminals of the electronic part, comprising:
    a first step of forming at least one circuit element on the surface of a large ceramic substrate;
    a second step of fixing the conductive balls to terminal portions of the circuit element;
    a third step of forming division grooves for the large ceramic substrate on the surface of the substrate on which the circuit element exists; and
    a fourth step of applying stress to the large ceramic substrate to open the division grooves, to divide the substrate, the first, second, third and fourth steps being performed in the stated order,
    wherein the fourth step is performed in a state in which a buffer member is located on the surface of the large ceramic substrate to which the conductive balls are fixed, the buffer member having a concave portion to house the conductive balls and a convex portion in contact with the surface of the substrate and/or the circuit element and by doing so, all stress to be applied in the fourth step is applied to the substrate and/or the circuit element.

7. A method of manufacturing an electronic part according to claim 6, wherein the division grooves exist on the surface of the substrate to which the conductive balls are fixed.

8. A method of manufacturing an electronic part according to claim 6, wherein the conductive balls are fixed to the substrate using a conductive bonding agent.

9. A method of manufacturing an electronic part according to claim 6, wherein the concave portion of the buffer member does not come into contact with the conductive balls.

* * * * *